US007785990B2

(12) United States Patent
Kim

(10) Patent No.: US 7,785,990 B2
(45) Date of Patent: Aug. 31, 2010

(54) SEMICONDUCTOR DEVICE AND METHOD OF FABRICATING THE SAME

(75) Inventor: Young-Ho Kim, Hwaseong-si (KR)

(73) Assignee: Samsung Electronics Co., Ltd., Suwon-Si (KR)

(*) Notice: Subject to any disclaimer, the term of this patent is extended or adjusted under 35 U.S.C. 154(b) by 0 days.

(21) Appl. No.: 12/409,052

(22) Filed: Mar. 23, 2009

(65) Prior Publication Data

US 2009/0246938 A1 Oct. 1, 2009

(30) Foreign Application Priority Data

Mar. 25, 2008 (KR) .................. 10-2008-0027482

(51) Int. Cl.
*H01L 21/00* (2006.01)
(52) U.S. Cl. ................ 438/462; 257/E21.599
(58) Field of Classification Search .......... 438/462, 438/463, 464, 460; 257/E21.599
See application file for complete search history.

(56) References Cited

U.S. PATENT DOCUMENTS 7,179,722 B2* 2/2007 Murata et al. ............ 438/460

2006/0003552 A1* 1/2006 Okada ..................... 438/462

FOREIGN PATENT DOCUMENTS

| JP | 2005-051007 | 2/2005 |
|----|-------------|--------|
| KR | 10-1999-0000220 | 1/1999 |
| KR | 1019990017980 | 3/1999 |
| KR | 1020070074937 | 7/2007 |

* cited by examiner

*Primary Examiner*—Charles D Garber
*Assistant Examiner*—Reema Patel
(74) *Attorney, Agent, or Firm*—F. Chau & Associates, LLC

(57) ABSTRACT

A method of forming a semiconductor device includes forming a first chip region, a second chip region, and a scribe lane region between the first and second chip regions in a wafer, the wafer having a first surface and a second surface facing the first surface, and forming a penetrating extension hole and a scribe connector in the scribe lane region, the penetrating extension hole penetrating the wafer from the first surface to the second surface and extending along the scribe lane region, wherein the scribe connector connects the first and second chip regions spaced apart from each other by the penetrating extension hole.

17 Claims, 10 Drawing Sheets

SEMICONDUCTOR DEVICE AND METHOD OF FABRICATING THE SAME

CROSS-REFERENCE TO RELATED APPLICATION

This application claims priority under 35 U.S.C. §119 to Korean Patent Application No. 10-2008-0027482, filed on Mar. 25, 2008, the entire contents of which are hereby incorporated by reference.

BACKGROUND

1. Technical Field

The present disclosure relates to a semiconductor device and a method of forming the same, and more particularly, to a method of separating a semiconductor chip from a wafer.

2. Discussion of Related Art

A process for forming a semiconductor device includes a front-end process and a back-end process. In the front-end process, semiconductor chips are formed on a wafer through, for example, photolithography, deposition, and etching processes. In the back-end process, each semiconductor chip is assembled in a package. The back-end process includes a dicing process for dicing a plurality of semiconductor chips formed on the wafer into individual semiconductor chips. The dicing process may include a sawing process using a sawing machine. However, when using a sawing machine in the sawing process, an edge portion of the semiconductor chip can be damaged.

SUMMARY

According to an exemplary embodiment of the present invention, a method of forming a semiconductor device comprises forming a first chip region, a second chip region, and a scribe lane region between the first and second chip regions in a wafer, the wafer having a first surface and a second surface facing the first surface, and forming a penetrating extension hole and a scribe connector in the scribe lane region, the penetrating extension hole penetrating the wafer from the first surface to the second surface and extending along the scribe lane region, wherein the scribe connector connects the first and second chip regions spaced apart from each other by the penetrating extension hole.

The method may further comprise applying a force to the scribe connector to disconnect the first and second chip regions from each other.

The scribe lane region may comprise a first region extending in a first direction and a second region extending in a second direction perpendicular to the first direction.

The penetrating extension hole may extend along at least one of the first direction or the second direction.

The penetrating extension hole may have a width narrower than a width of the scribe lane region.

The scribe connector can be formed across at least one of the first region or the second region of the scribe lane region.

A width of the scribe connector can be substantially smaller than a length of a side of the first chip region.

A thickness of the scribe connector can be thinner than a thickness of the wafer.

The scribe connector can have a top surface formed lower than the first surface of the wafer.

Applying the force to the scribe connector may comprise applying a supersonic wave to the scribe connector.

Forming the penetrating extension hole and the scribe connector may comprise forming a mask layer on the first surface, the mask layer covering the first and second chip regions and covering a portion of the scribe lane region and having an opening exposing the scribe lane region, and etching an exposed portion of the scribe lane region of the wafer using the mask layer as an etch mask.

The mask layer may cover at least a portion of the scribe lane region surrounding each of the first and second chip regions.

The mask layer can be formed by performing a photolithography process.

The opening can have a width narrower than a width of the scribe lane region.

The etching process may include an anisotropic etching process.

Forming the penetrating extension hole and the scribe connector may comprise forming a first mask layer on the first surface, the first mask layer covering the first and second chip regions and having a first opening exposing the scribe lane region, etching an exposed portion of the scribe lane region of the wafer using the first mask layer as an etch mask to form a trench, removing the first mask layer, forming a second mask layer covering the first and second chip regions and covering a portion of the trench to form a second opening exposing the trench, and etching the exposed portion of the trench using the second mask layer as an etch mask.

The second mask layer may cover at least a portion of the trench surrounding each of the first and second chip regions.

The second surface of the wafer can be polished.

According to an exemplary embodiment of the present invention, a semiconductor device comprises an active surface on which an integrated circuit is disposed and an inactive surface opposite to the active surface, a plurality of lateral surfaces connecting edges of the active surface and the inactive surface, and a protrusion extending from at least one lateral surface of the plurality of lateral surfaces.

The protrusion can have a thickness smaller than a distance between the active surface and the inactive surface.

BRIEF DESCRIPTION OF THE DRAWINGS

Exemplary embodiments of the present invention can be understood in more detail from the following description taken in conjunction with the accompanying drawings in which.

DETAILED DESCRIPTION OF EXEMPLARY EMBODIMENTS

Exemplary embodiments of the present invention will be described below in more detail with reference to the accompanying drawings. The present invention may, however, be embodied in many different forms and should not be construed as limited to the exemplary embodiments set forth herein.

Figure 1A:
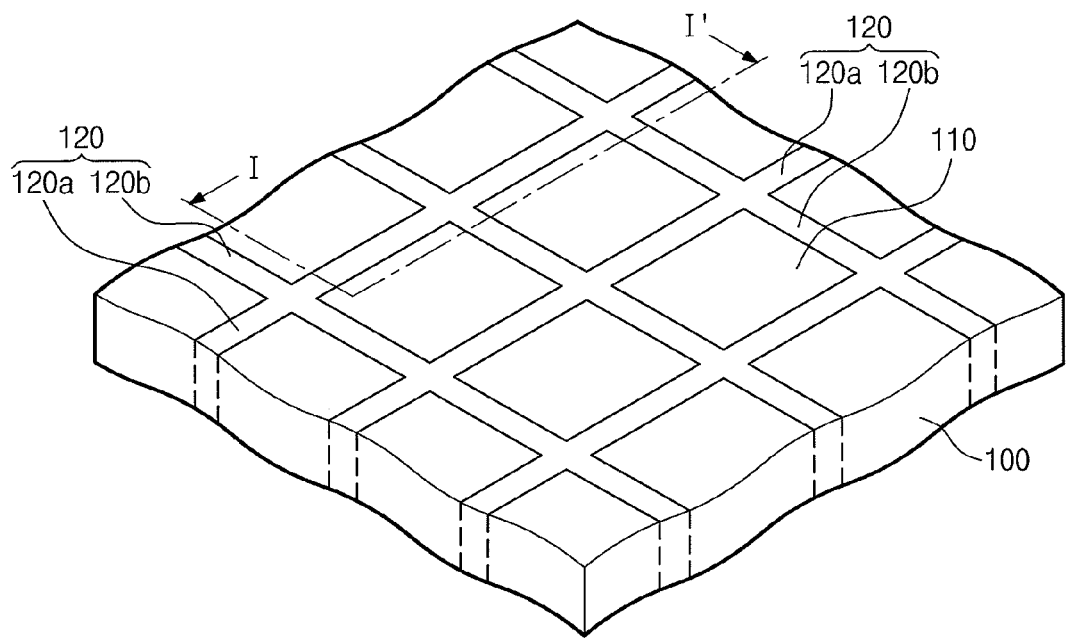
FIGS. 1A, 2A, 3A, and 4 are perspective views showing a method of forming a semiconductor device according to an exemplary embodiment of the present invention.
Figure 1B:
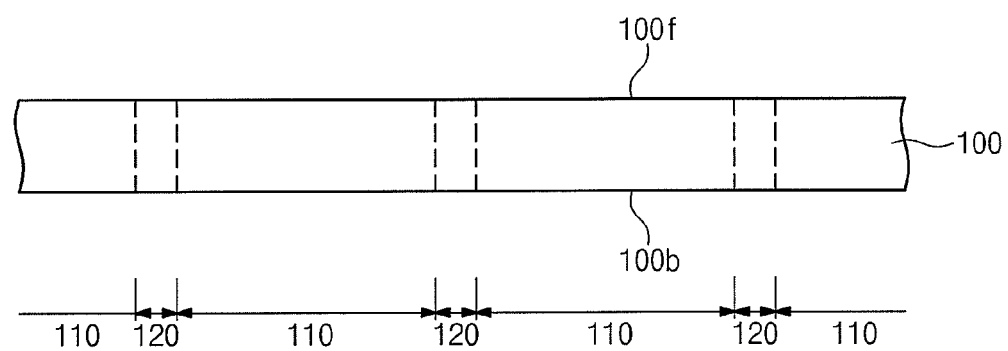
FIG. 1B is a cross-sectional view taken along the line I-I' of FIG. 1A showing a method of forming the semiconductor device according to an exemplary embodiment of the present invention.

Referring to FIGS. 1A and 1B, a wafer 100 includes a first surface 100f including a plurality of chip regions 110 and a scribe lane region 120 between the chip regions 110. For example, the wafer 100 may be a semiconductor wafer comprising single crystal silicon. The wafer 100 has a second surface 100b opposite to the first surface 100f. The second surface 100b of the wafer 100 may be a grinded surface on which a back-grinding process is performed for thinning a thickness of the wafer 100. The back-grinding process may include a polishing process using a grinding method.

The chip regions 110 may be two-dimensionally arranged on the first surface 100f of the wafer 100. A semiconductor chip can be formed in each of the chip regions 110. The semiconductor chip may include a semiconductor memory device or a logic device. The scribe lane region 120 may include a first region 120a extending in a first direction and a second region 120b extending in a second direction perpendicular to the first direction. For example, the first and second regions 120a and 120b may have a straight lane shape. The chip regions 110 are surrounded by the scribe lane region 120, and are spaced apart from each other with the scribe lane region interposed between adjacent chip regions.

Figure 2A:
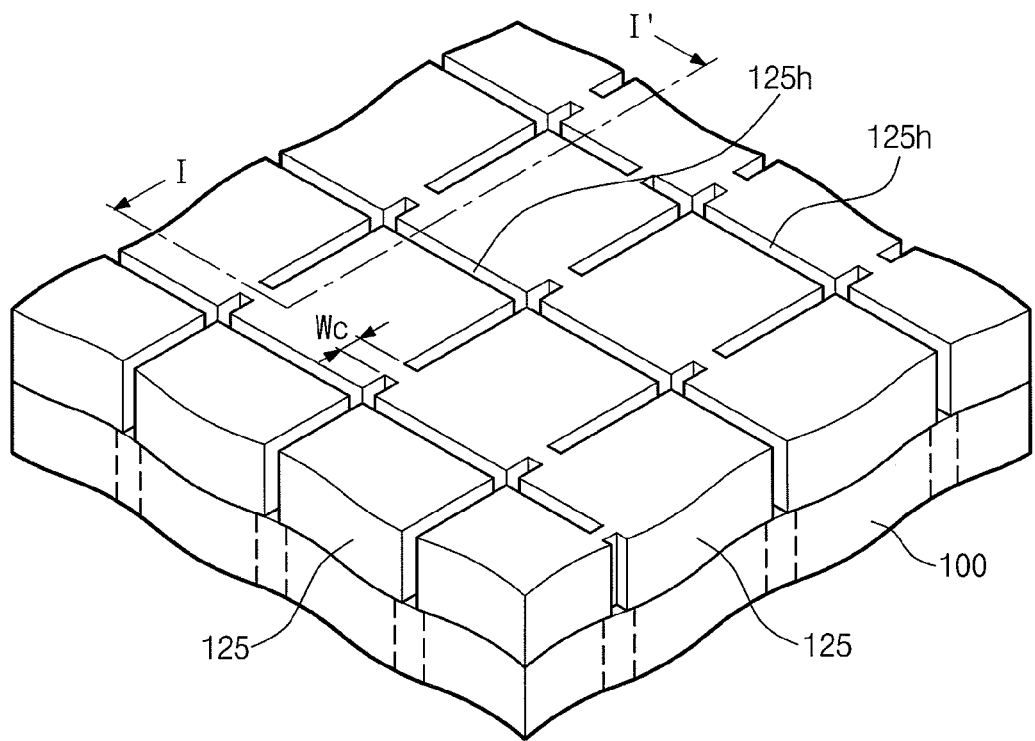
Figure 2B:
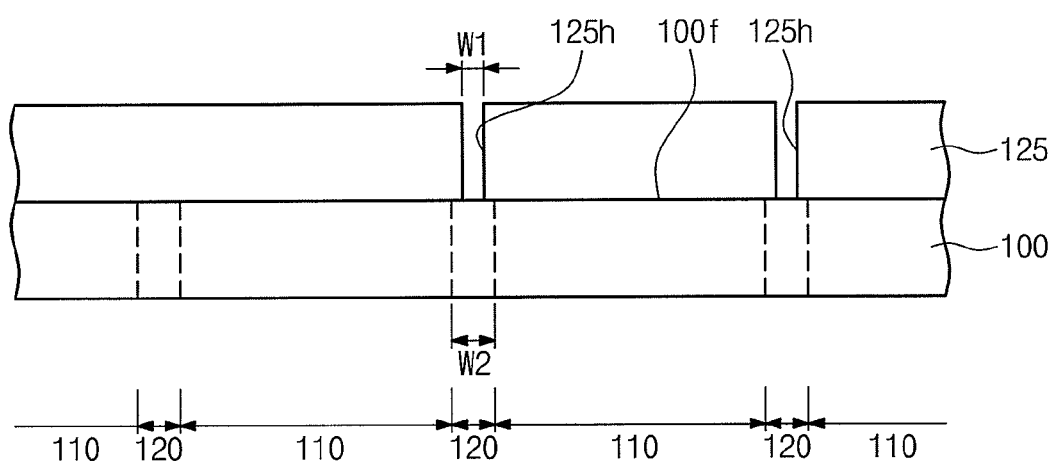
FIG. 2B is a cross-sectional view taken along the line I-I' of FIG. 2A showing a method of forming the semiconductor device according to an exemplary embodiment of the present invention.

Referring to FIGS. 2A and 2B, a mask layer 125 having an opening 125h is formed on the first surface 100f. The mask layer 125 covers the chip regions 110 and edge portions of the scribe lane region 120 between the chip regions 110. The opening 125h exposes a central portion of the scribe lane region 120. For example, the mask layer 125 may include a photoresist layer. The mask layer 125 may be formed using a photolithography process. Thus, the mask layer 125 has a width W1 narrower than a width W2 of the scribe lane region 120.

The mask layer 125 may cover at least a portion of the scribe lane region 120 surrounding each of the chip regions 110. At least a portion of the mask layer 125 covering the scribe lane region 120 is formed across the first region 120a and/or the second region 120b of the scribe lane region 120. The portion of the mask layer 125 formed across the first region 120a and the second region 120b has a predetermined width Wc and is connected to the mask layer 125 covering the chip regions 110.

Figure 3A:
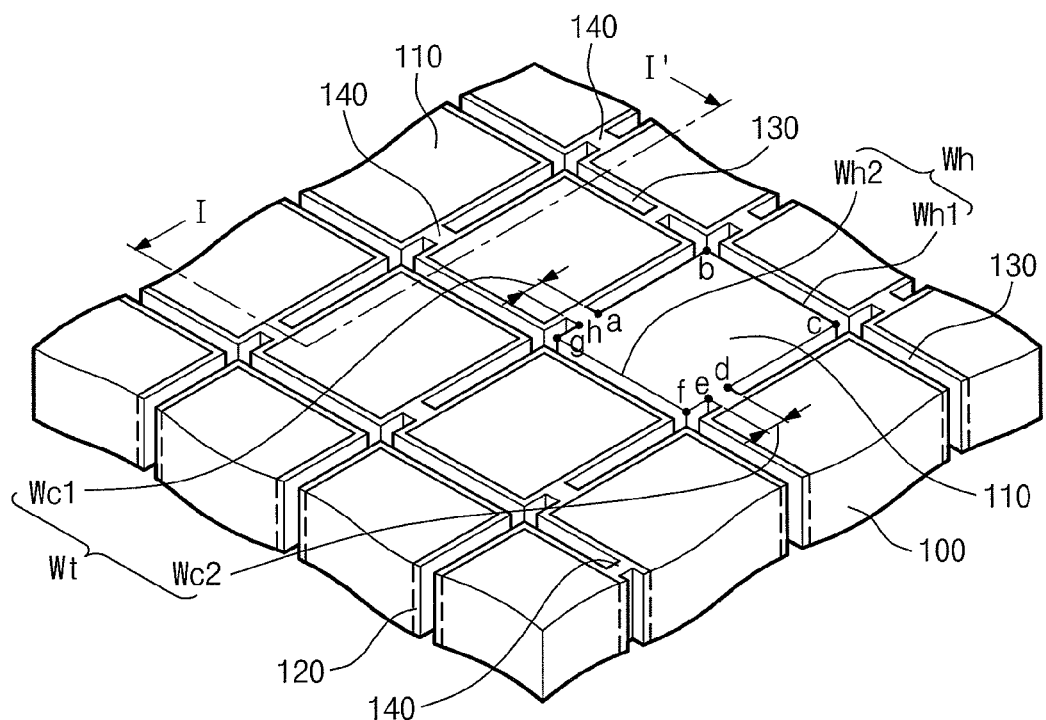
Figure 3B:
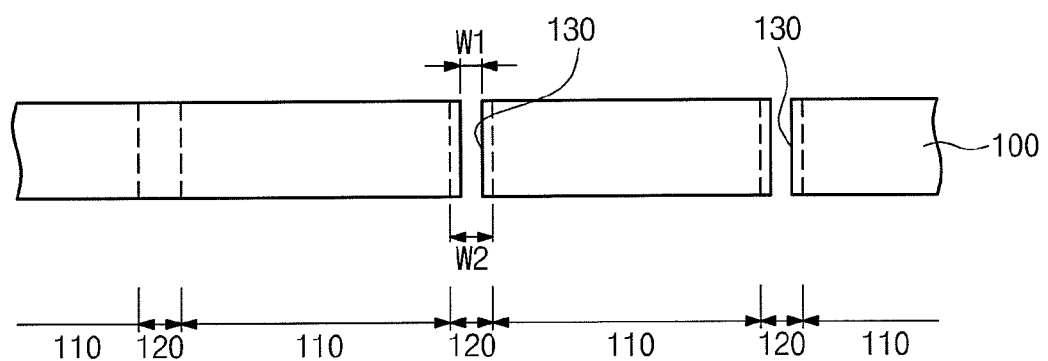
FIG. 3B is a cross-sectional view taken along the line I-I' of FIG. 3A showing a method of forming the semiconductor device according to an exemplary embodiment of the present invention.

Referring to FIGS. 3A and 3B, the exposed portion of the scribe lane region 120 is etched using the mask layer 125 as an etch mask to form penetrating extension holes 130 and scribe connectors 140. The scribe connectors 140 are formed in the penetrating extension holes 130 and connect two adjacent chip regions 110. The etching process may include an anisotropic etching process. For example, the etching process may include a plasma etching process using a mixture gas of HBr, $Cl_2$, and F.

The penetrating extension holes 130 may extend along the first region 120a and/or the second region 120b of the scribe lane region 120. That is, the penetrating extension holes 130 can be formed by removing a substantial portion of the scribe lane region 120 surrounding the chip regions 110. For example, the penetrating extension holes 130 penetrate from the first surface 100f to the second surface 100b except for the area where the scribe connectors 140 are formed. Each of the penetrating extension holes 130 may have a width W1 narrower than the width W2 of the scribe lane region 120. Each of the scribe connectors 140 is formed across the first region 120a and/or the second region 120b of the scribe lane region 120.

The sum Wt of the widths of the scribe connectors 140 connected to one chip region 110 may be less than one third of an extension distance Wh of a single penetrating extension hole 130 surrounding each of the chip regions 110. For example, a width Wc of the scribe connector 140 is substantially smaller than a length of a side of the chip region 110. Referring to FIG. 3A, the sum Wt of the widths is the sum of a first width Wc1 and a second width Wc2. For example, the sum Wt may be less than about 1 mm. The extension distance Wh is the sum of a first distance Wh1 and a second distance Wh2. The first distance Wh1 is a distance from point a through b and c to d. The second distance Wh2 is a distance from point e through f and g to h. That is, the penetrating extension holes 130 may occupy a substantial portion of the scribe lane region 120 as compared to the scribe connectors 140. Thus, the chip regions 110 are connected to each other by the scribe connectors 140 with a minimum connection force which can be easily removed when an outside force is applied.

The scribe connectors 140 include at least one scribe connector formed adjacent each of the chip regions 110. The chip regions 110 are connected to each other through the scribe connectors 140 in the wafer 100. Thus, in the back-end process where separated semiconductor chips are assembled in a package, semiconductor chips are transferred in the form of the wafer 100 rather than in the form of separated semiconductor chips according to an exemplary embodiment of the present invention. Then, separating the wafer 100 into individual chips is performed.

According to an exemplary embodiment of the present invention, a method of forming the semiconductor device may be performed to a second surface 100b opposite to the first surface 100f of the wafer 100 using a method similar to an exemplary embodiment shown in connection with FIGS. 1A, 1B, 2A, 2B, 3A and 3B.

Figure 4:
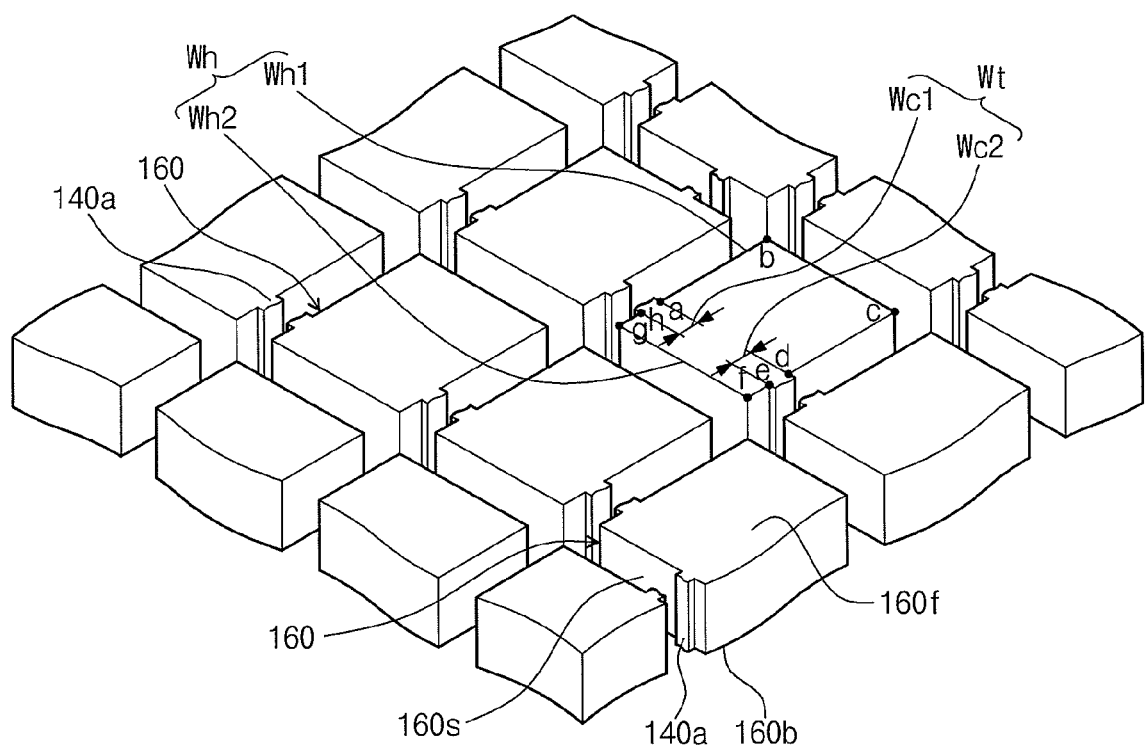

Referring to FIG. 4, the scribe connectors 140 are cut to separate the wafer 100 into a plurality of semiconductor chips 160. The cutting process may include applying a physical force to the scribe connectors 140. For example, the cutting process may include applying supersonic waves to the scribe connectors 140.

Each of the separated semiconductor chips 160 may include an active surface 160f, an inactive surface 160b, a plurality of lateral surfaces 160s and protrusions 140a. The active surface 160f is opposite to the inactive surface 160b. The plurality of lateral surfaces 160s connect edges of the active surface 160*f* and the inactive surface 160*b*. Each of the protrusions 140*a* protrudes from at least one lateral surface 160*s* of the plurality of lateral surfaces 160*s*. For example, four lateral surfaces may be provided. The sum Wt of widths of the protrusions 140*a* connected to one semiconductor chip 160 may be less than one third of a connection distance Wh of the edges of the semiconductor chip 160. Referring to FIG. 4, the sum Wt of the widths may be the sum of a first width Wc1 and a second width Wc2. For example, the sum Wt may be less than about 1 mm. The connection distance Wh is the sum of a first distance Wh1 and a second distance Wh2. The first distance Wh1 is a distance from point a through b and c to d. The second distance Wh2 is a distance from point e through f and g to h.

According to an exemplary embodiment of the present invention, the photolithography process and an etching process are performed to form the penetrating extension holes 130 and the scribe connectors 140 in the scribe lane region 120. A force, for example, a physical force, is applied to the scribe connectors 140 to separate semiconductor chips 150 from each other. As such, according to an exemplary embodiment, mechanical damage such as a chipping phenomenon or a creaking phenomenon occurring in a sawing process can be minimized or eliminated.

According to an exemplary embodiment of the present invention, the scribe connectors 140 may be cut by a small amount of physical force such as, for example, the oscillation of a supersonic wave applied thereto. Therefore, the semiconductor chips 150 can be separated from each other without damage thereto. Since photolithography/etching methods are used in an exemplary embodiment of the present invention, the scribe lane region 120 has a width narrower than that of a scribe lane region used in a sawing process. That is, the width of the scribe lane region 120 corresponds to the widths of the penetrating extension holes 130 according to an exemplary embodiment of the present invention. As such, a gap between each semiconductor chip is reduced. Therefore, more semiconductor chips can be integrated on a single wafer.

After the cutting process is completed, the separated semiconductor chips 160 may be assembled in small, light and thin packages such as, for example, QFP, BGA, or CSP using a wire bonding or flip chip method. In an exemplary embodiment, the separated semiconductor chips 160 may be assembled in a high-speed and high-density system package such as, for example, a multichip module (MCM) in which non-packaged semiconductor chips are used.

Figure 5A:
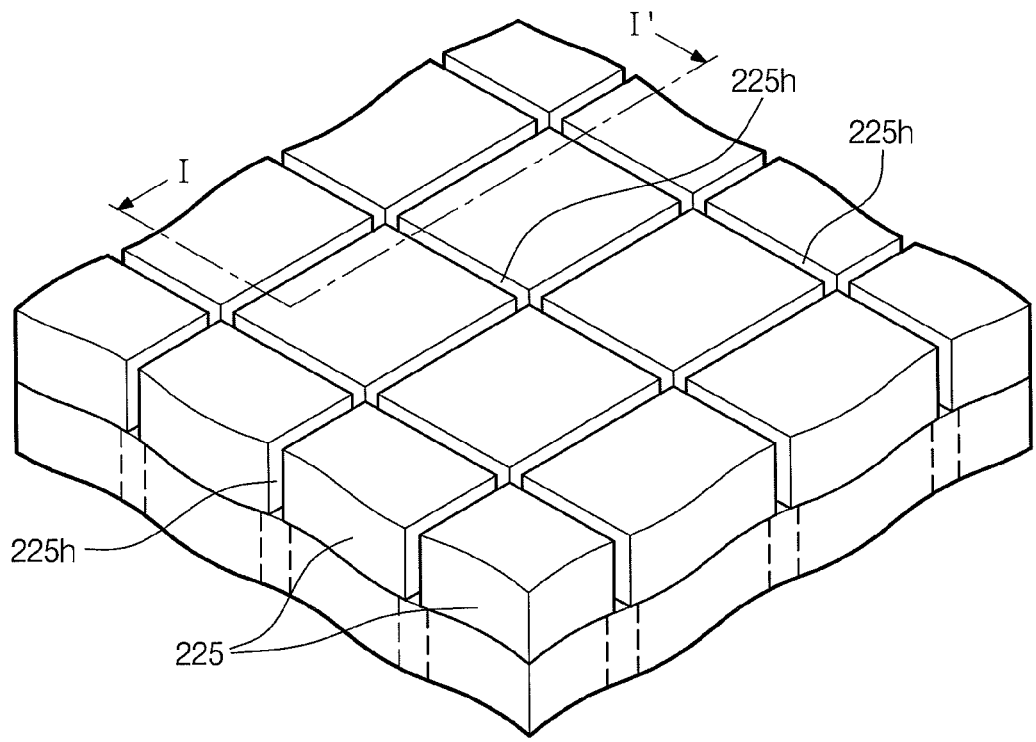
FIGS. 5A, 6A, 7A, 8A, and 9 are perspective views showing a method of forming a semiconductor device according to an exemplary embodiment of the present invention.
Figure 5B:
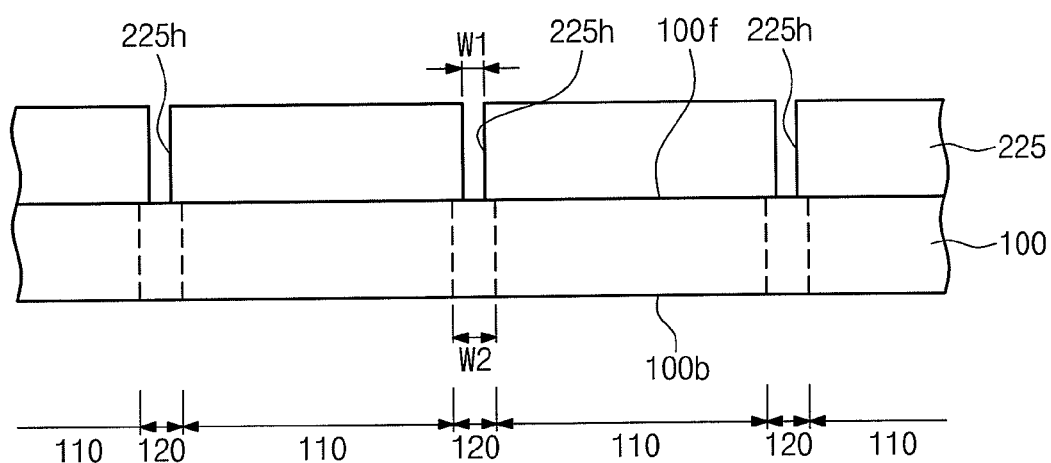
FIG. 5B is a cross-sectional view taken along the line I-I' of FIG. 5A showing a method of forming the semiconductor device according to an exemplary embodiment of the present invention.

Referring to FIGS. 5A and 5B, the wafer 100 includes the plurality of chip regions 110 and the scribe lane region 120 defined between the chip regions 110. The wafer 100 has the first surface 100*f* and the second surface 100*b* opposite to the first surface 100*f*.

A first mask layer 225 covers the chip regions 110 and includes a first opening 225*h* exposing the scribe lane region 120. The first mask layer 225 is formed on the first surface 100*f*. For example, the first mask layer 225 may include a photoresist layer. A width W1 of the first opening 225*h* may be narrower than a width W2 of the scribe lane region 120.

Figure 6A:
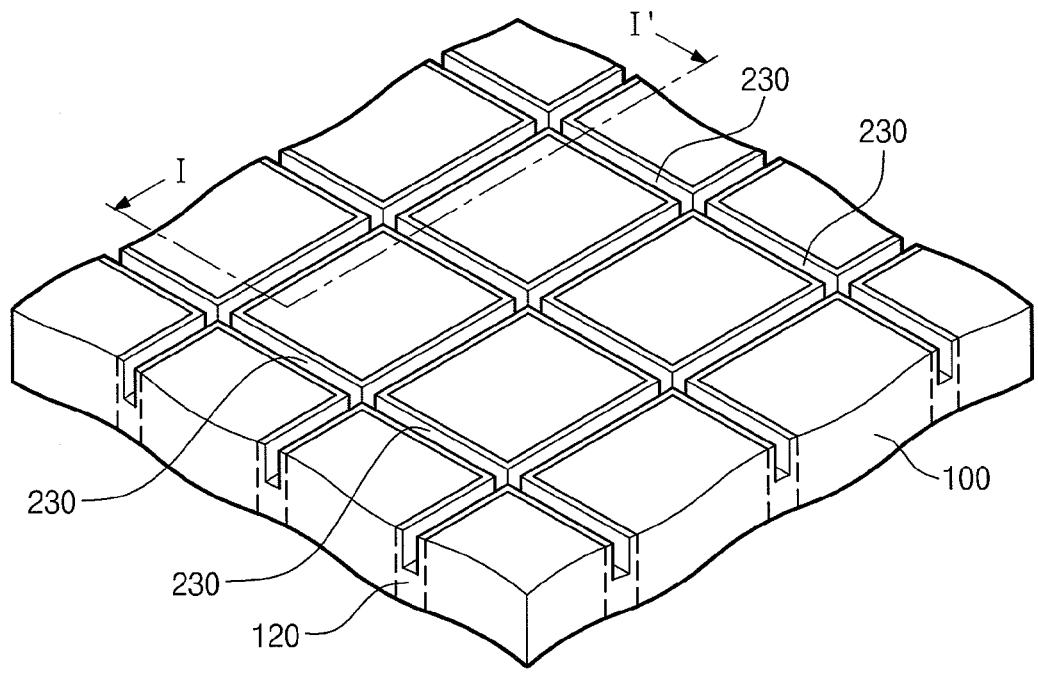
Figure 6B:
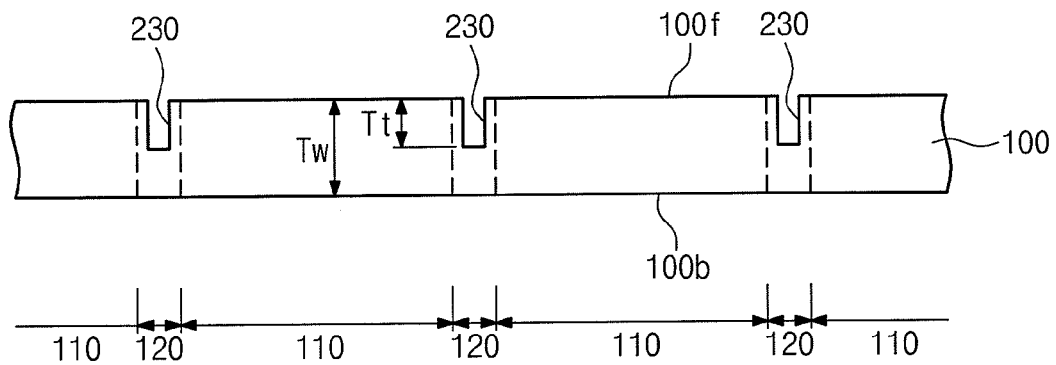
FIG. 6B is a cross-sectional view taken along the line I-I' of FIG. 6A showing a method of forming the semiconductor device according to an exemplary embodiment of the present invention.

Referring to FIGS. 6A and 6B, the exposed portion of the scribe lane region 120 is etched using the first mask layer 225 as an etch mask to form a trench 230. The etching process may include an anisotropic etching process. The trench 230 has a depth Tt shallower than a thickness Tw of the wafer 100. The trench 230 may be disposed in the scribe lane region 120 along circumference of each of the chip regions 110. For example, an ashing process may be performed to remove the first mask layer 225.

Figure 7A:
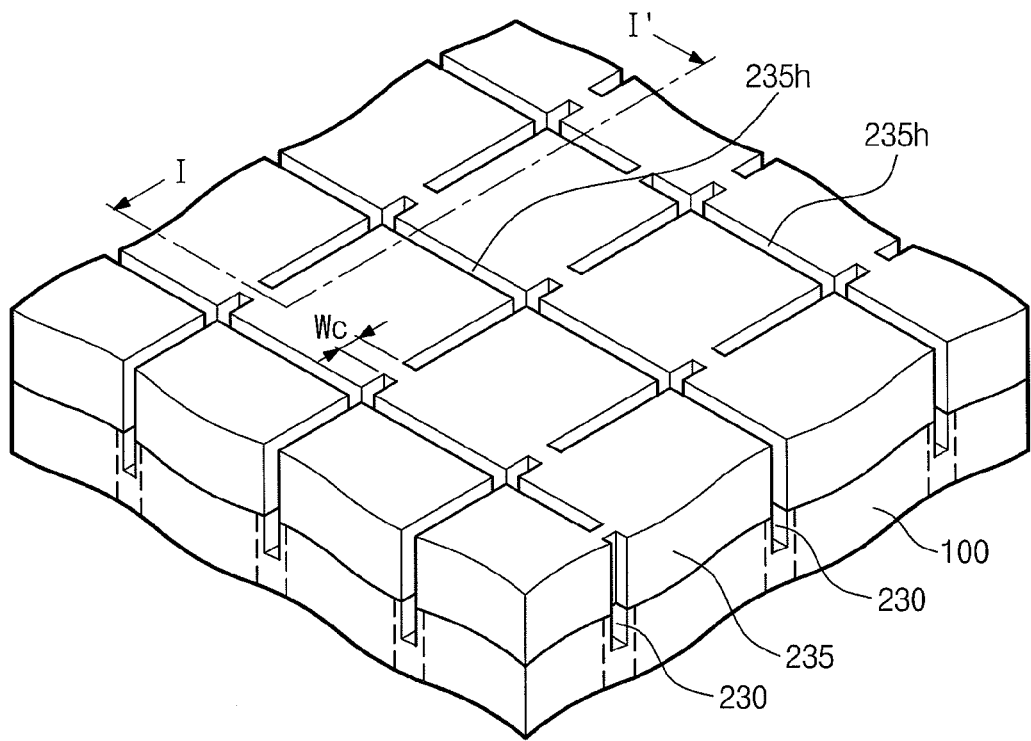
Figure 7B:
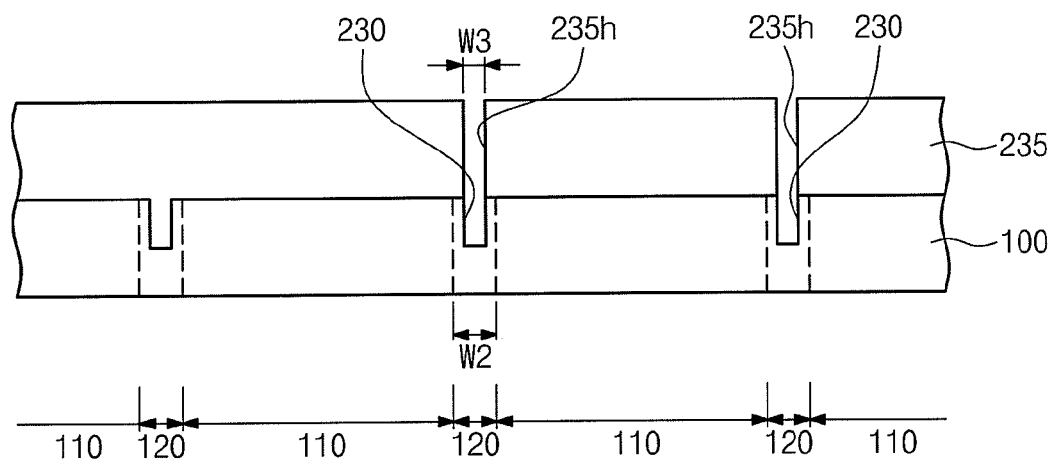
FIG. 7B is a cross-sectional view taken along the line I-I' of FIG. 7A showing a method of forming the semiconductor device according to an exemplary embodiment of the present invention.

Referring to FIGS. 7A and 7B, a second mask layer 235 having a second opening 235*h* is formed on the wafer 100. The second mask layer 235 covers the chip regions 110 and covers a first portion of the trench 230. The second opening 235*h* may expose a second portion of the trench 230, which is not covered by the second mask layer 235. A width W3 of the second opening 235*h* may be narrower than the width W2 of the scribe lane region 120. For example, the second mask layer 235 may include a photoresist layer.

The second mask layer 235 may cover at least a portion of the trench 230 surrounding each of the chip regions 110. At least a portion of the second mask layer 235 covering the trench 230 may be formed over the first region 120*a* and/or the second region 120*b* of the scribe lane region 120. The portion of the second mask layer 235 covering the trench 230 has a predetermined width Wc, and is connected to the second mask layer 235 covering the chip regions 110. The predetermined width Wc may be less than about 1 mm.

Figure 8A:
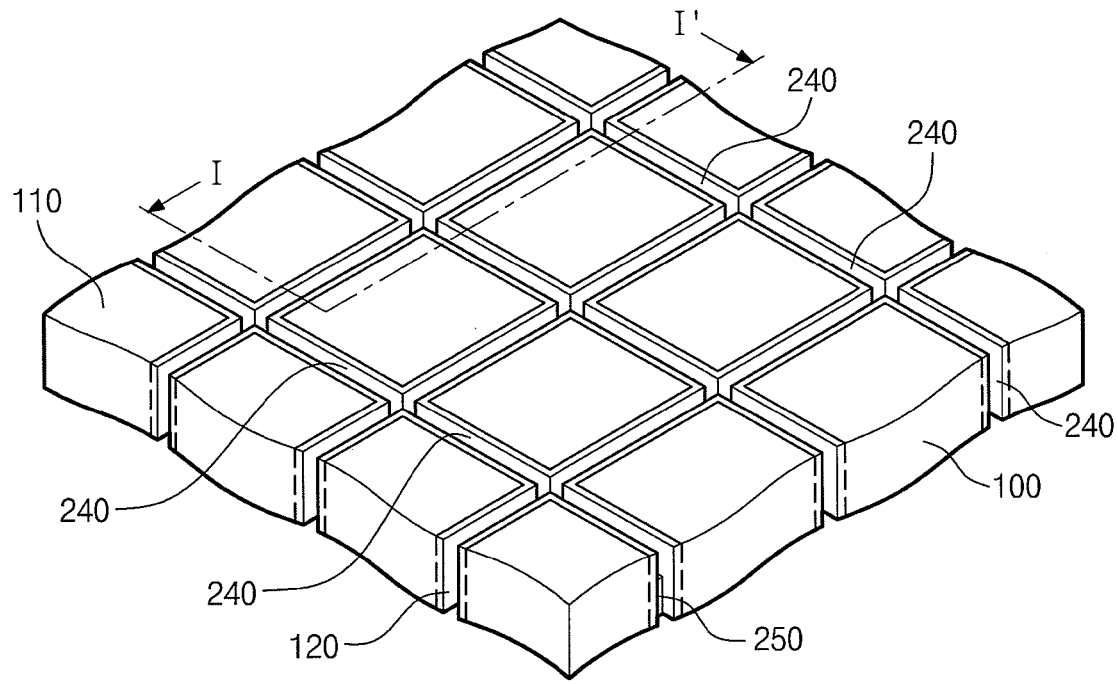
Figure 8B:
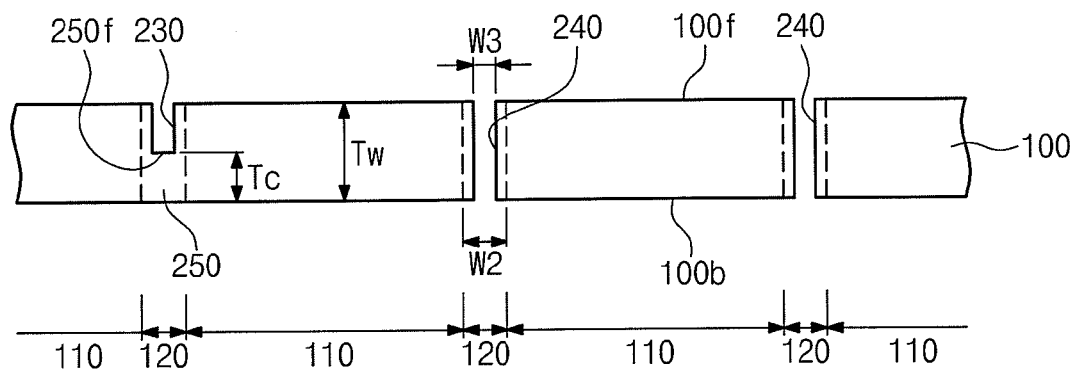
FIG. 8B is a cross-sectional view taken along the line I-I' of FIG. 8A showing a method of forming the semiconductor device according to an exemplary embodiment of the present invention.

Referring to FIGS. 8A and 8B, the exposed portion of the trench 230 is etched using the second mask layer 235 as an etch mask to form penetrating extension holes 240 extending from the trench 230 and scribe connectors 250 formed in the penetrating extension holes 240. The etching process may include an anisotropic etching process.

The penetrating extension holes 240 may extend along the first region 120*a* and/or the second region 120*b* of the scribe lane region 120. That is, the penetrating extension holes 240 can be formed by removing a substantial portion of the scribe lane region 120 surrounding the chip regions 110. For example, the penetrating extension holes 240 penetrate from the first surface 100*f* to the second surface 100*b* except for the area where the scribe connectors 250 are formed. Each of the penetrating extension holes 240 may have the width W3 narrower than the width W2 of the scribe lane region 120. Each of the scribe connectors 250 may be formed across the first region 120*a* and/or the second region 120*b* of the scribe lane region 120 and have a predetermined width Wc. In an exemplary embodiment of the present invention, each of the scribe connectors 250 may have an upper surface 250*f* lower than the first surface 100*f* of the wafer 100. That is, each of the scribe connectors 250 may have a thickness Tc thinner than the thickness Tw of the wafer 100. For example, an ashing process may be performed to remove the second mask layer 235.

According to an exemplary embodiment of the present invention, a method of forming the semiconductor device may be performed to a second surface 100*b* opposite to the first surface 100*f* of the wafer 100 using a method similar to an exemplary embodiment shown in connection with FIGS. 5A, 5B, 6A, 6B, 7A and 7B.

Figure 9:
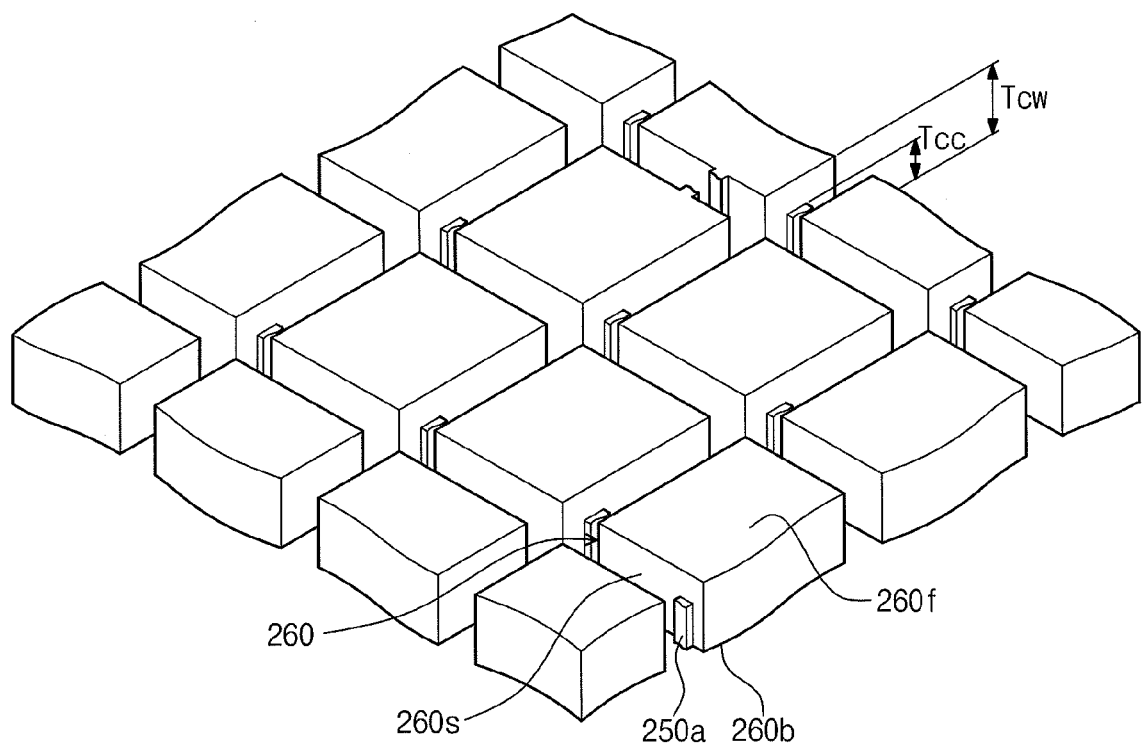

Referring to FIG. 9, the scribe connectors 250 are cut to separate the wafer 100 into a plurality of semiconductor chips 260. The cutting process may include applying a force, for example, a physical force to the scribe connectors 250. For example, the cutting process may include applying a supersonic wave to the scribe connectors 250.

Each of the separated semiconductor chips 260 includes an active surface 260*f*, an inactive surface 260*b*, a plurality of lateral surfaces 260*s*, and protrusions 250*a*. The active surface 260*f* is opposite to the inactive surface 260*b*. The plurality of lateral surfaces 260*s* may connect edges of the active surface 260*f* and the inactive surface 260*b*. Each of the protrusions 250*a* may protrude from at least one lateral surface 260*s* of the plurality of lateral surfaces 260*s*. A thickness Tcc of each of the protrusions 250*a* may be thinner than a thickness Tcw between the active surface 260*f* and the inactive surface 260*b*.

In an exemplary embodiment of the present invention, each of the scribe connectors 250 has the thickness Tc thinner than the thickness Tw of the wafer 100. Thus, the scribe connectors 250 may be cut with a less amount of external force applied thereto as compared when the scribe connectors 140 have a substantially same thickness with the thickness of the wafer 100. During a separation process, the semiconductor chips 260 may receive less damage because the scribe connectors 250 have less surface area as compared to the situation when the scribe connectors 140 have a substantially same thickness with the thickness of the wafer 100.

Figure 10:
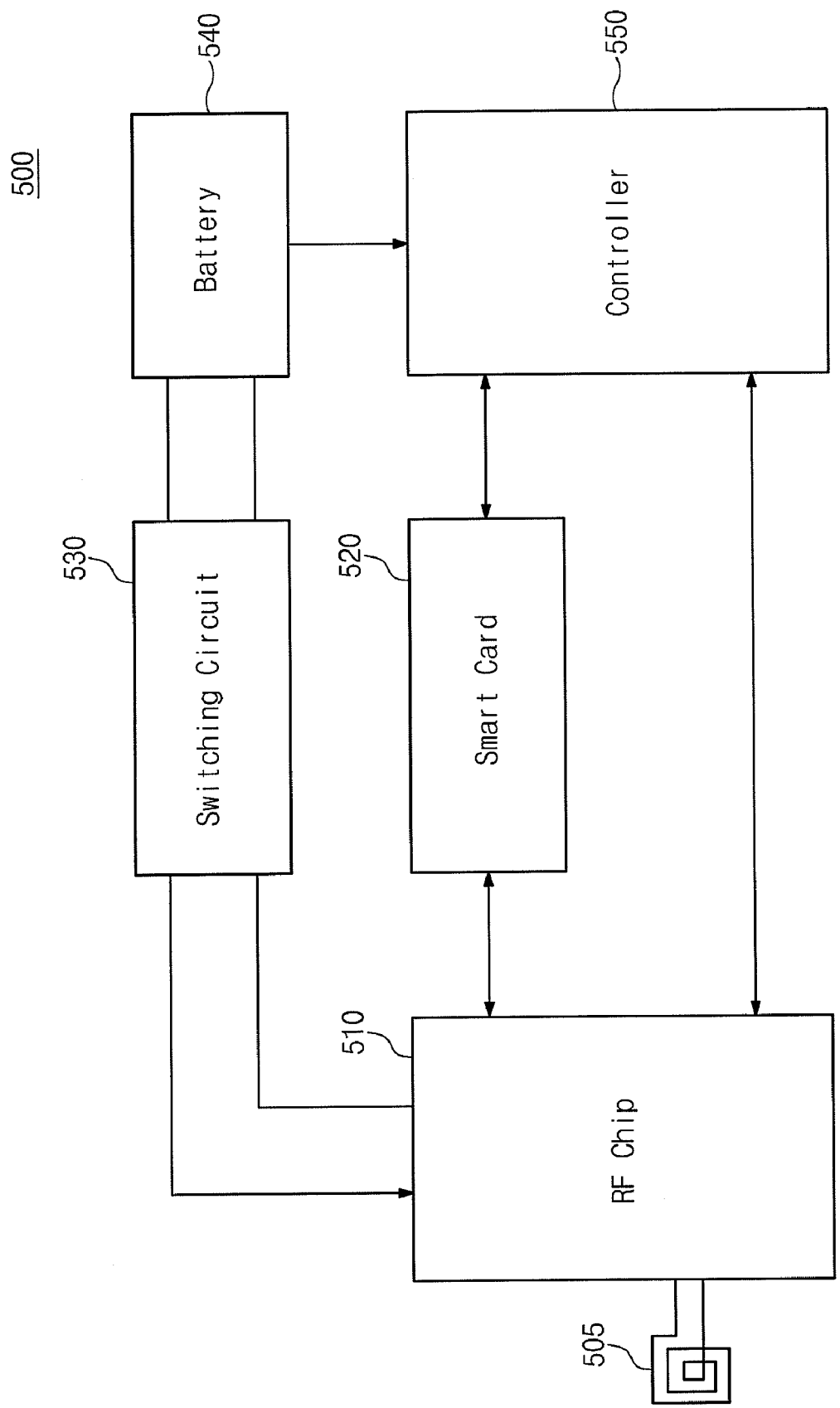
FIG. 10 is a block diagram showing a system of electronic apparatus including a semiconductor device according to an exemplary embodiment of the present invention.

FIG. 10 is a block diagram showing a system of electronic apparatus including a semiconductor device according to an exemplary embodiment of the present invention.

Referring to FIG. 10, an electronic apparatus according to an exemplary embodiment of the present invention may include a mobile communication terminal 500 including a radio frequency communication chip (RF chip) 510, a smart card 520, a switching circuit 530, a battery 540, and a controller 550. The mobile communication terminal 500 may include the separated semiconductor chip, for example, chip 160 or 260 according to exemplary embodiments of the present invention. The separated semiconductor chips may be used for a memory chip or a logic chip. For example, the RF chip 510 may include a processor and the memory chip. The smart card 520 may include the memory chip, and the controller 550 may include the logic chip.

The RF chip 510 transmits and receives data with an RFID Identifier by transmission and reception of a radio signal through an antenna 505. The RF chip 510 transmits a signal received from the smart card 520 or the controller 550 to the RFID Identifier, and a signal received from the RFID Identifier to the smart card 520 or the controller 550 through the antenna 505. The smart card 520 communicates with the RF chip 510 and the controller 550. The battery 540 supplies a power source to the mobile communication terminal 500. The controller 550 controls an overall operation of the mobile communication terminal 500.

For example, the electronic apparatus including a semiconductor device according to an exemplary embodiment of the present invention may include various mobile devices such as a personal digital assistant (PDA), an MP3 player, a moving picture decoder, and a portable game, a desktop computer, a large-scaled computer, a global position system (GPS), a PC card, a notebook computer, a camcorder, and a digital camera.

Although exemplary embodiments have been described with reference to the accompanying drawings, it is to be understood that the present invention is not limited to these precise embodiments but various changes and modifications can be made by one skilled in the art without departing from the spirit and scope of the present invention. All such changes and modifications are intended to be included within the scope of the invention as defined by the appended claims.

The invention claimed is:

1. A method of forming a semiconductor device, the method comprising:
    forming a first chip region, a second chip region, and a scribe lane region between the first and second chip regions in a wafer, the wafer having a first surface and a second surface facing the first surface; and
    forming a penetrating extension hole and a scribe connector in the scribe lane region, the penetrating extension hole penetrating the wafer from the first surface to the second surface and extending along the scribe lane region,
    wherein the scribe connector connects the first and second chip regions spaced apart from each other by the penetrating extension hole, wherein the penetrating extension hole has a width narrower than a width of the scribe lane region.

2. The method of claim 1, further comprising applying a force to the scribe connector to disconnect the first and second chip regions from each other.

3. The method of claim 2, wherein applying the force to the scribe connector comprises applying a supersonic wave to the scribe connector.

4. The method of claim 1, wherein the scribe lane region comprises a first region extending in a first direction and a second region extending in a second direction perpendicular to the first direction.

5. The method of claim 4, wherein the penetrating extension hole extends along at least one of the first direction or the second direction.

6. The method of claim 5, wherein the scribe connector is formed across at least one of the first region or the second region of the scribe lane region.

7. The method of claim 6, wherein a width of the scribe connector is substantially smaller than a length of a side of the first chip region.

8. The method of claim 1, wherein a thickness of the scribe connector is thinner than a thickness of the wafer.

9. The method of claim 8, wherein the scribe connector has a top surface formed lower than the first surface of the wafer.

10. The method of claim 1, wherein forming the penetrating extension hole and the scribe connector comprises:
    forming a first mask layer on the first surface, the first mask layer covering the first and second chip regions and having a first opening exposing the scribe lane region;
    etching an exposed portion of the scribe lane region of the wafer using the first mask layer as an etch mask to form a trench;
    removing the first mask layer;
    forming a second mask layer covering the first and second chip regions and covering a portion of the trench to form a second opening exposing the trench; and
    etching the exposed portion of the trench using the second mask layer as an etch mask.

11. The method of claim 10, wherein the second mask layer covers at least a portion of the trench surrounding each of the first and second chip regions.

12. The method of claim 1, wherein the second surface of the wafer is polished.

13. The method of claim 1, wherein forming the penetrating extension hole and the scribe connector comprises:
    forming a mask layer on the first surface, the mask layer covering the first and second chip regions and covering a portion of the scribe lane region and having an opening exposing the scribe lane region; and
    etching an exposed portion of the scribe lane region of the wafer using the mask layer as an etch mask.

14. The method of claim 13, wherein the mask layer covers at least a portion of the scribe lane region surrounding each of the first and second chip regions.

15. The method of claim 13, wherein the mask layer is formed by performing a photolithography process.

16. The method of claim 13, wherein the opening has a width narrower than a width of the scribe lane region.

17. The method of claim 13, wherein the etching process includes an anisotropic etching process.

* * * * *